Aug. 18, 1953 D. T. ARMSTRONG 2,649,577

TRANSMISSION LINE TUNING DEVICE FOR ELECTRONIC SYSTEMS

Filed April 13, 1949

DAVID T. ARMSTRONG,
INVENTOR.

BY ~ [signature]

ATTORNEY

Patented Aug. 18, 1953 2,649,577

UNITED STATES PATENT OFFICE 2,649,577

TRANSMISSION LINE TUNING DEVICE FOR ELECTRONIC SYSTEMS

David T. Armstrong, Weehawken, N. J., assignor of one-half to John W. Wolfe, Palisades Park, N. J.

Application April 13, 1949, Serial No. 87,147

1 Claim. (Cl. 333—82)

The present invention relates to transmission line tuners for radio frequency energy.

The principal object of this invention is to provide novel and improved transmission line tuning devices for use between successive stages of a radio frequency amplifier, for selectively transferring radio frequency energy from the first to the second of such stages, and particularly for the purpose of eliminating spurious responses in the unused portion of the transmission line.

Another object of this invention is to provide novel and improved constructions for tuners of the character mentioned, adaptable for use in systems employing a plurality of such devices arranged in a predetermined electrical relationship which must be preserved, so that upon the making of adjustments in one, corresponding and proper adjustments will automatically be made to occur in the other of such associated devices, a manipulation commonly called "tracking."

A further object hereof is to provide novel and improved tuning devices of the type set forth, which are compact in form, easy to use, reasonably cheap to manufacture and efficient in carrying out the purposes for which they are designed.

Other objects and advantages will become apparent as this disclosure proceeds.

In the accompanying drawings forming part of this specification, similar characters of reference indicate corresponding parts in all the views, Fig. 1 is a schematic circuit diagram showing a known form of tuning device connected across the grids of two successive stages of a radio frequency amplifier.

Figure 1:
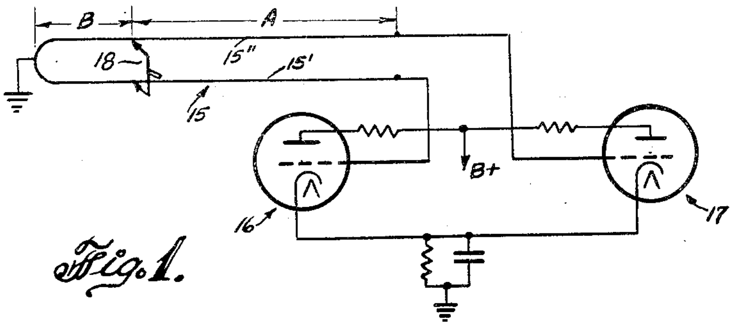

In the drawings, the numeral 15 indicates a tuning device of the type heretofore used. Essentially it is comprised of a pair of spaced, bared, parallel conductors 15′ and 15″, electrically connected at one of their ends to ground, and their other ends respectively electrically connected to either the plates or grids of successive stages 16 and 17, of a radio frequency amplifier. Electrically connected contacts slidable along said conductors to effect connection of a pair of opposite points, were employed to accomplish tuning by change of the effective length "A," as indicated at 18. It is found however, that spurious responses result in the unused section "B" of said tuner 15, causing objectionable disturbances in the system.

Figure 2:
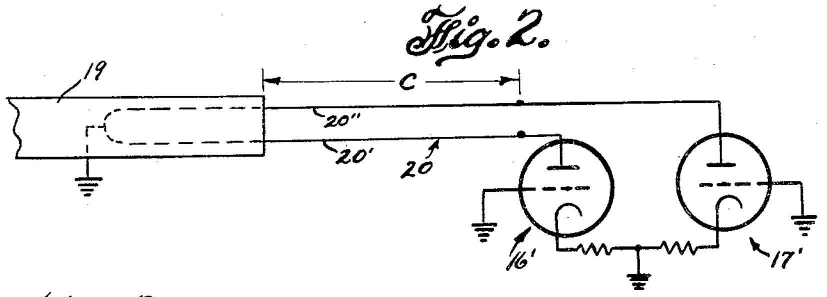
Fig. 2 is a schematic circuit diagram showing a tuning device embodying the teachings of this invention, connected to the plates of two successive stages of a radio frequency amplifier.

Such unfavorable condition is corrected by the teachings of the present invention, which contemplates that substantially the whole of the unused parts of said conductors shall be in electrical contact with each other longitudinally, as for instance is effected with a third conductor 19, which is in longitudinal sliding contact with both of the conductors 20′ and 20″, of the tuner 20 shown in Fig. 2.

Practical compact constructions of tuning devices embodying the features of this invention, will now be described.

Figure 3:
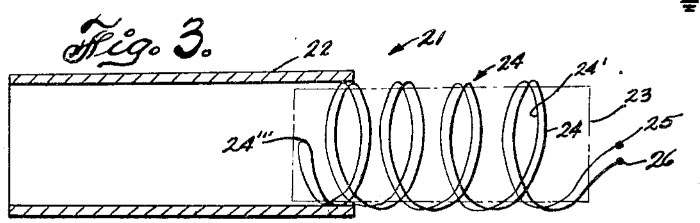
Fig. 3 is a central longitudinal, partly sectional view of a tuner in accordance with the present invention.
Figure 6:
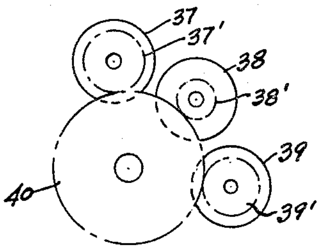
Fig. 6 is a schematic view of arrangement of gear means adapted for use with a plurality of such tuning devices whose electrical relation is to be preserved.

In Fig. 3, such a tuner designated generally by the numeral 21, comprises a metal tube 22 and a cylindrical body 23 of insulative material. A bare wire bent in two sections maintained in spaced relation, is wound as a coil on member 23, so that the turns of one section of said wire are respectively intermediate the turns of the other section of said wire, with all turns spaced from one another. Such a coil designated by the numeral 24, is cemented or otherwise suitably secured on the member 23. One section of the wire so wound is 24′, the other 24″, and their point of juncture 24‴. The numerals 25 and 26 designate the terminals of said coil, which are for electrical connection respectively to the plates of stages 16 and 17, or else to the grids of the successive stages 16′ and 17′ of a radio frequency amplifier. Member 23 carrying coil 24, is slidable within the metal tube 22, with juncture 24‴ first therein; the dimensions of the components of said tuner 21, being such that the interior surface of the tube 22 will contact all turns of the coil 24, positioned within said tube. It is evident that the tube 22 is the third conductor spoken of which is in longitudinal sliding contact with both of the conductors 24′ and 24″.

Figure 4:
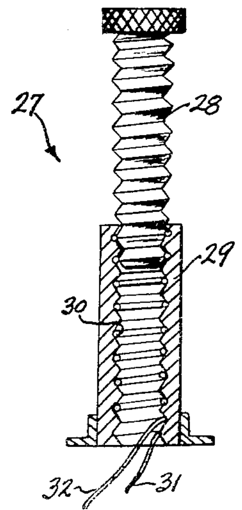
Fig. 4 and Fig. 5, show modified constructions.

In Fig. 4, the tuning device 27, comprises a metal screw 28 in threaded engagement with an interiorly threaded tubular member 29 of insulative material; such threads being of the double-lead type. A coil 30 akin to the structure of the aforementioned coil 24, is laid and secured within the respective grooves of the threads of the threaded bore of member 29. The screw 28, enters member 29 at the end thereof having the junction of the two conductors comprising the coil 30. The terminals of said coil being shown at 31 and 32.

Figure 5:
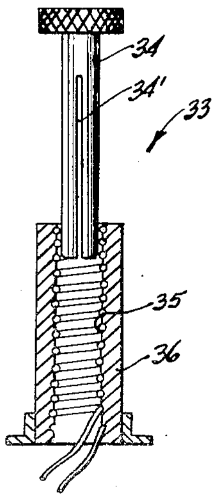

In Fig. 5, the tuner 33 is like that shown in Fig. 4, except that in place of the screw 28, a slidable metal pin 34 is used, to make contact with the turns of the coil 35, which coil is like 30, mounted in an insulative material member 36 which is like member 29. The pin 34 may be a split pin having the longitudinal slot 34'.

In the same manner as the metal tube 22 contacts the turns of the coil 24, so are the dimensions of the screw 28, and of pin 34, that they respectively contact the turns of the coils 30 and 35, and their movement with respect to their respectively associated coils will alter the effective length indicated in Fig. 2, by the letter "C."

In systems employing a plurality of such tuning devices whose electrical relation need be preserved, a procedure commonly termed "tracking," the use of tuners 37, 38 and 39, of the type shown in Fig. 4, are particularly adaptable. Each of the screws akin to 28 of such tuners, carries a wide faced gear, all of which gears 38', 37' and 39' are in engagement with a single driver gear 40. Said three driven gears are chosen of such size as to number of teeth, that their respective ratios with each other will accomplish movement of such screws with respect to their associated coils, in the required relation to maintain a predetermined electrical relation between said group of tuners for which tuners are initially set.

This invention is capable of numerous forms and various applications without departing from the essential features herein disclosed. It is therefore intended and desired that the embodiments shown herein shall be deemed illustrative and not restrictive and that the patent shall cover all patentable novelty herein set forth; reference being had to the following claim rather than to the specific description herein to indicate the scope of this invention.

I claim:

In a tuning device of the character described, the combination of a pair of constant length electrical conductors spaced in parallel relation; said conductors being a single wire bent in half and formed as a pair of helical coils; the free ends of said wire constituting the terminals for connecting said device in a circuit and a double-lead screw of electrically conductive material and having a pitch corresponding with said coils, movable within said coils in threaded engagement therewith whereby all of the parts of all turns of said coils which are about the body of the screw are in electrical contact with said screw; said screw being positioned within said coils at their connected end, whereby said coils remain connected upon removal of the screw therefrom.

DAVID T. ARMSTRONG.

References Cited in the file of this patent

UNITED STATES PATENTS

| Number | Name | Date |
|---|---|---|
| 1,904,208 | Dow | Apr. 18, 1933 |
| 2,126,541 | De Forest | Aug. 9, 1938 |
| 2,226,479 | Pupp | Dec. 24, 1940 |
| 2,236,004 | MacLean | Mar. 25, 1941 |
| 2,246,928 | Schick | June 24, 1941 |
| 2,477,693 | Guanella | Aug. 2, 1949 |
| 2,509,057 | Guanella | May 23, 1950 |
| 2,599,126 | Reed | June 3, 1952 |